United States Patent [19]

Suzuki et al.

[11] 4,439,697

[45] Mar. 27, 1984

[54] SENSE AMPLIFIER CIRCUIT

[75] Inventors: Yasoji Suzuki, Yokosuka; Hiroaki Suzuki; Yukihiro Saeki, both of Yokohama, all of Japan

[73] Assignee: Tokyo Shibaura Denki Kabushiki Kaisha, Kawasaki, Japan

[21] Appl. No.: 333,321

[22] Filed: Dec. 22, 1981

[30] Foreign Application Priority Data

Jan. 12, 1981 [JP] Japan .................................. 56-2980

[51] Int. Cl.³ ...................... H03K 5/153; H03K 5/24; G11C 7/06
[52] U.S. Cl. .................................. 307/530; 365/203; 365/104; 365/204; 307/469
[58] Field of Search ............... 307/530, 363, 364, 469; 365/191, 195, 196, 203, 206, 204, 103, 104

[56] References Cited

U.S. PATENT DOCUMENTS 4,048,626 9/1977 Fett .................................. 365/104 X

FOREIGN PATENT DOCUMENTS 52-8735 1/1977 Japan .................................. 307/530
56-105394 8/1981 Japan .................................. 365/104

OTHER PUBLICATIONS

Cordaro, "Read-Only Storage Bit Precharge/Sense Circuit", IBM Tech. Discl. Bull., vol. 17, No. 4, p. 1044, Sep. 1974.

Primary Examiner—Larry N. Anagnos
Assistant Examiner—David R. Bertelson
Attorney, Agent, or Firm—Finnegan, Henderson, Farabow, Garrett & Dunner

[57] ABSTRACT

A sense amplifier circuit is disclosed in which a ROM is grouped into a plurality of ROM arrays and outputs from sense amplifiers provided for each ROM array are supplied to a single output terminal. In the sense amplifier circuit, each sense amplifier has a P-MOS FET connected between the output of the ROM array and a ground terminal and connected at the gate to a preset terminal, P-MOS FETs connected between the output of the ROM array and a positive power source and whose gates are respectively connected to the output terminal and a preset terminal, and an N MOS FET connected between the output terminal and the ground terminal and at the gate to the output terminal of the ROM array. Further, a P MOS FET is connected between the output terminal and the power source terminal and at the gate to an inverted preset terminal.

8 Claims, 7 Drawing Figures

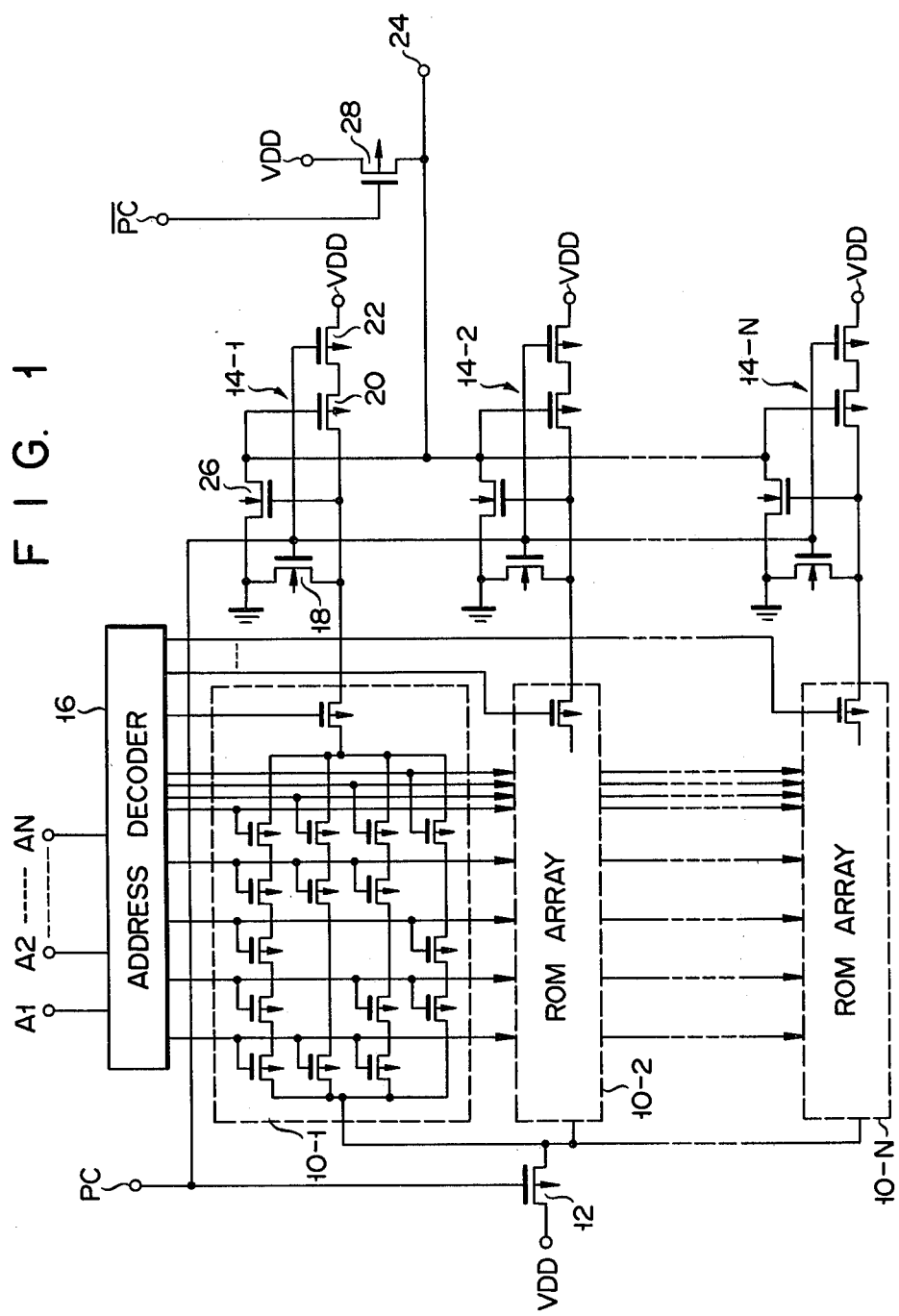
F I G. 1

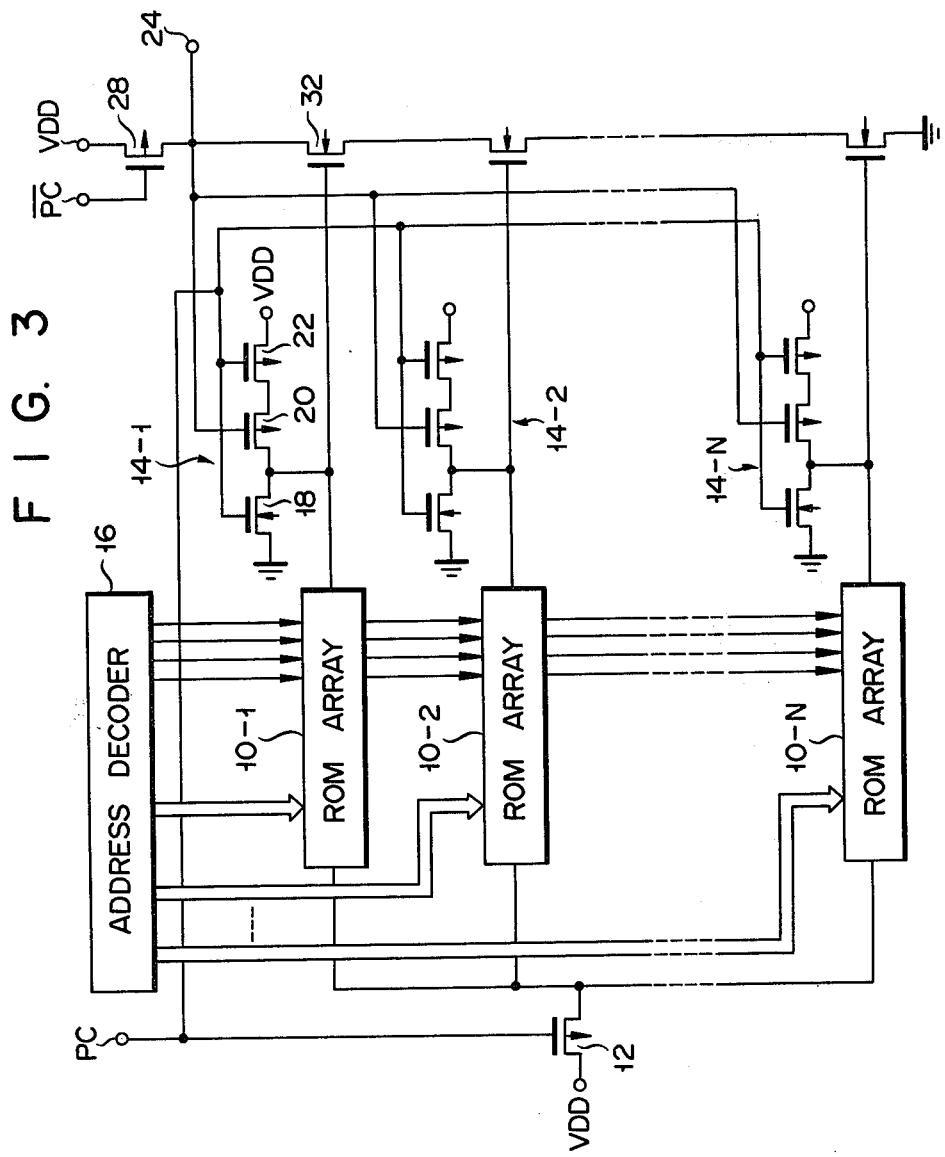
F I G. 3

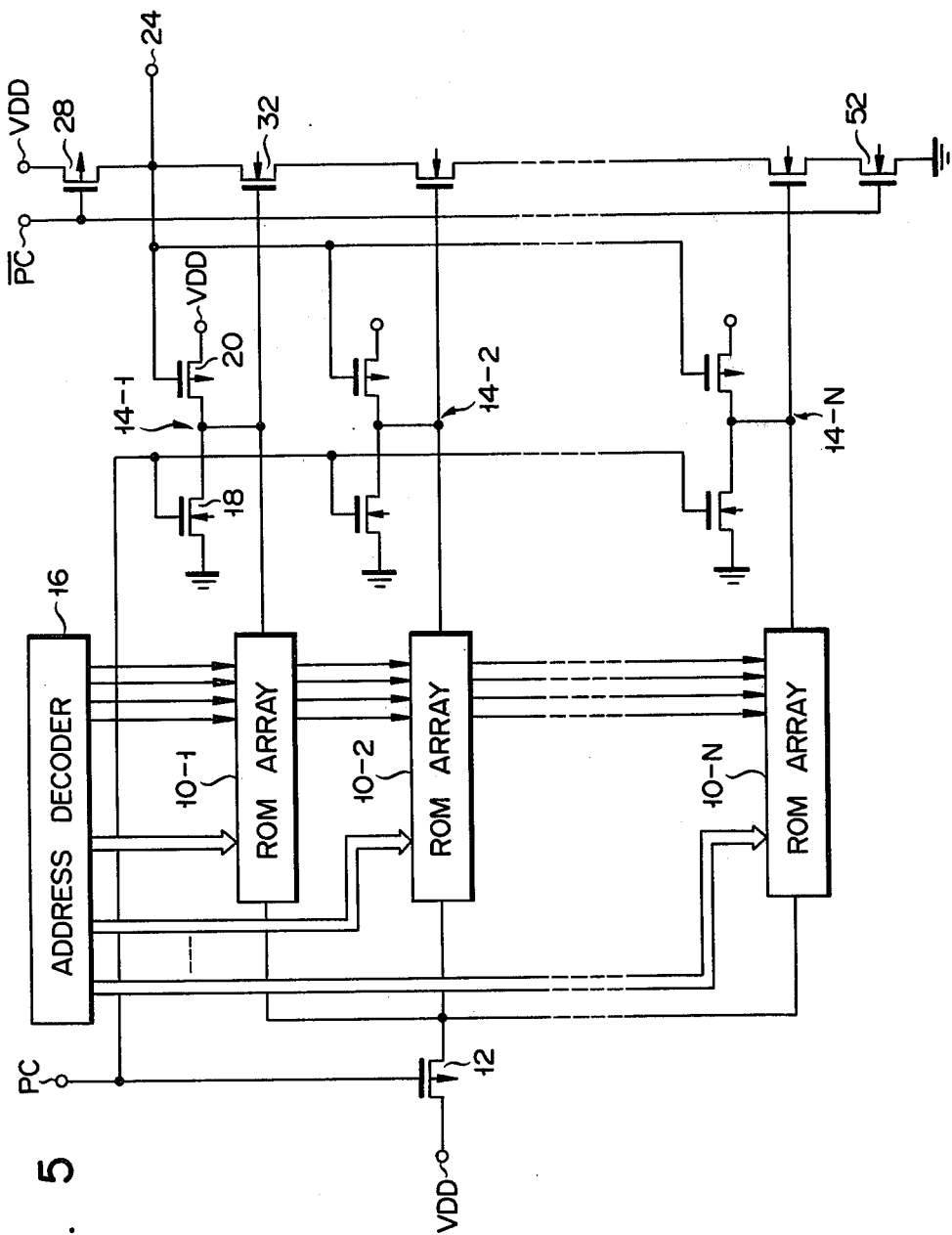
F I G. 5

SENSE AMPLIFIER CIRCUIT

BACKGROUND OF THE INVENTION

The present invention relates to a sense amplifier circuit for a read only memory (ROM) in a complementary metal-oxide-semiconductor (CMOS) integrated circuit.

In a sense amplifier circuit for judging output levels of a ROM in a CMOS integrated circuit, a high speed is generally required for the judgment. MOS transistors are selectively formed in the cells in a manner to form a dynamic ROM of the AND type. In a precharge mode, negative charges are stored in a stray capacitor formed at the output of the ROM. In a read mode, the charge is discharged through a specified cell. In this case, the discharge is prohibited or allowed in accordance with the presence or absence of the transistor, respectively. When the discharge is allowed, the level of the output terminal rises. An access time taken for the output level to reach a given threshold level is shorter as the stray capacitance is smaller. When the capacity of the ROM is made large, the stray capacitance becomes large, with the result that the access time is long. There has been an approach to solve this problem in which a large capacity ROM is divided into a plurality of small capacity ROM arrays, and output signals from those ROM arrays are level-judged and then the output signal is produced from the judged signals with a logic circuit. This approach, however, has a disadvantage of increase of the elements.

An inverter for the output level judgment is constructed of a CMOS circuit. In this circuit construction, when the output level is higher than a threshold level of an N channel transistor but lower than a threshold level of a P channel transistor, both the transistors are conductive, so that a through current falls therethrough, resulting in unnecessary power consumption. Although the access time to the ROM can be made short by lowering the threshold level of the inverter, there is a limit in lowering the threshold level.

SUMMARY OF THE INVENTION

Accordingly, an object of the present invention is to provide a sense amplifier circuit for a ROM which shortens an access time without increasing the number of elements and power consumption, compared to the prior circuits, and is suitable for a CMOS integrated circuit.

To achieve the above object of the present invention, there is provided a sense amplifier circuit which is used for a plurality of ROM arrays each having a single output terminal in a CMOS integrated circuit, and has a plurality of input terminals respectively connected to the output terminals of the ROM arrays and a single output terminal; the sense amplifier circuit comprising first and second power source terminals, first and second clock terminals supplied with complementary signals, a plurality of first transistors of a first channel type each connected between the first power source terminal and a corresponding one of the input terminals and each having a control terminal connected to the first clock terminal, a plurality of second transistors of a second channel type each connected between the second power source terminal and a corresponding one of the input terminals and each having a control terminal connected to the output terminal, a plurality of third transistors of the first channel type connected between the output terminal and the first power source terminal and each having a control terminal connected to a corresponding one of the input terminals, a plurality of fourth transistors connected between the first and second power source terminals through a corresponding one of the second and third transistors and each having a control terminal connected to either of the first and second clock terminals, and a fifth transistor of the second channel type connected between the output terminal and the second power source terminal and having a control terminal connected to the second clock terminal.

BRIEF DESCRIPTION OF THE DRAWINGS

FIG. 1 shows a circuit diagram of an embodiment of a sense amplifier circuit according to the present invention;

FIGS. 3 to 5 show circuit diagrams of second to fourth embodiments of the present invention.

DETAILED DESCRIPTION OF THE PREFERRED EMBODIMENTS

Figure 2A:
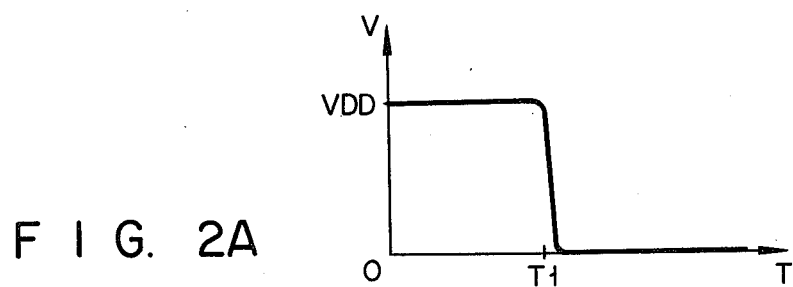
FIGS. 2A to 2C illustrate signal waveform diagrams showing the operation of the sense amplifier circuit.

An embodiment of a sense amplifier circuit according to the present invention will be described referring to the accompanying drawings. In FIG. 1, dynamic ROM arrays 10-1, 10-2, ..., 10-N of the AND type using P channel MOS FETs are provided. Source-drain paths of the P MOS FETs in each row of the ROM array are connected in series with a source-drain path of a row selecting P MOS FET. Both ends of all the row components in each ROM array are connected commonly. The common connection points of all the ROM arrays are further connected in common at one end and connected to a power source terminal VDD through a source-drain path of a P MOS FET 12. A gate of the P MOS FET 12 is connected to a precharge terminal PC. The other common connection points in all the ROM arrays 10-1, 10-2, ..., 10-N are respectively connected to sense amplifiers 14-1, 14-2, ..., 14-N through source-drain paths of array selecting P MOS FETs. The corresponding column is connected to column selecting terminals (4 terminals from left in the drawing) of an address decoder 16. The gates of the corresponding row selecting transistors are commonly connected to row selecting terminals (4 terminals in the central part of the drawing). The gates of the array selecting transistors in the ROM arrays are connected to array selecting terminals of the address decoder 16. As described above, the column and row selecting lines are connected in common to all the ROM arrays in order to reduce the number of those lines in the present embodiment. It is for this reason that the array selecting transistors are provided in the ROM arrays, respectively. The address decoder 16 includes address signal input terminals A1, A2, ..., AN.

An output terminal of the ROM array, i.e., a drain of the array selecting a P MOS FET is grounded through a source-drain path of an N MOS FET 18, and a gate of the N MOS FET 18 is connected to the precharge terminal PC. The output terminal of the ROM array is also connected to a positive power source terminal VDD through source-drain paths of P MOS FETs 20 and 22 in series. A gate of the P MOS FET 20, i.e., an output terminal of each sense amplifier is connected to a common output terminal 24 and grounded through a source-drain path of an N MOS FET 26. A gate of the P MOS FET 22 is connected to the precharge terminal PC. A gate of the N MOS FET 26 is connected to an output terminal of the ROM array 10. In other words, the transistors 26 of the sense amplifiers 14-1, 14-2, . . . , 14-N form a NOR gate for the respective output signals of the ROM arrays 10-1, 10-2, . . . , 10-N. The common output terminal 24 is connected to the power source terminal VDD through a source-drain path of a P MOS FET 28 whose gate is connected to an inverted precharge terminal $\overline{PC}$.

Figure 2B:
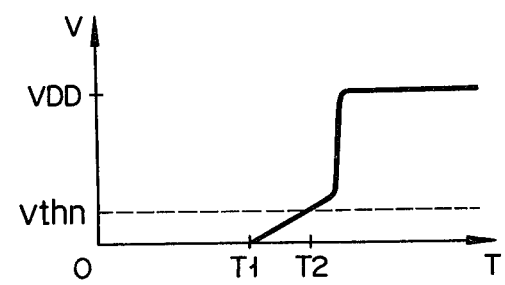
Figure 2C:
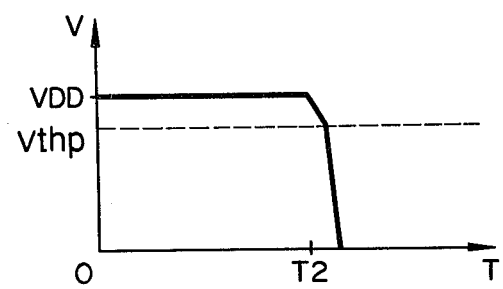

An operation of the embodiment will be described referring to the signal waveforms of key portions of the circuit shown in FIGS. 2A to 2C. FIG. 2A shows a precharge signal supplied to the precharge terminal PC, FIG. 2B shows an output signal of the ROM array, and FIG. 2C shows an output signal derived from the common output terminal 24. An inverted signal of the precharge signal designated in FIG. 2A is supplied to the inverted precharge terminal $\overline{PC}$. In response to an address signal, the address decoder 16 sets only one of the column selecting terminals to logic 1 (H level) and the other terminals to logic 0 (L level), only one of the row selecting terminals is at the L level and the other terminals are at the H level, and only one of array selecting terminals is at the L level and the other terminals are at the H level. The transistors of the ROM arrays connected to a selected column are nonconductive, while the transistors in the remaining columns are in a conductive state. The transistors connected to a selected row are conductive, while transistors in the remaining rows are in a nonconductive state. Also, the array selecting transistor of a selected array is in a conductive state. In this way, one column and one row are selected from the ROM arrays 10-1, 10-2, . . . , 10-N, and only one cell is addressed. If a transistor is present in the addressed cell, the ROM array is in a nonconductive state. If the transistor is not present in the address cell, the ROM array is in a conductive state. Now, let it be assumed that the addressed cell is in the ROM array 10-1.

Meanwhile, when the precharge signal is an in H level as shown in FIG. 2A, the P MOS FET 12 and the N MOS FET 18 are nonconductive and conductive, respectively. For this reason, a connection point of the ROM array 10-1 and the P MOS FET 12 is in an H level, the output terminal of the ROM array 10-1 is precharged to be at L level as shown in FIG. 2B. At this time, the N MOS FET 26, which forms a NOR gate, is in a nonconductive state. An inverted precharge signal is in an L level and the P MOS FET 28 is in conductive state, the common output terminal 24 is precharged to be at H level as shown in FIG. 2C. The P MOS FET 20 in the sense amplifier 14-1 is also in a nonconductive state.

When the precharge signal is in an L level at time T1 as shown in FIG. 2A, the P MOS FET 12 is conductive, and the N MOS FET 18 is nonconductive. The P MOS FET 28 is made nonconductive by the inverted precharge signal in an H level, and a precharge between the both ends in the ROM array 10-1 is finished. After the end of the precharge, if the transistor is not in the addressed cell and the ROM array 10-1 is conductive, the negative charge stored in the output of the ROM array 10-1 is discharged through the ROM array 10-1. For this reason, an output signal of the ROM array 10-1 rises as shown in FIG. 2B. A level change at the output terminal is affected by a stray capacitor formed at the output terminal. The larger the stray capacitance, the slower the change. In this embodiment, since the ROM is segmented into N arrays, the stray capacitance is 1/N when compared with the ROM having the same number of cells. Therefore, the negative charge is quickly discharged.

When the output signal of the ROM array 10-1 exceeds a threshold voltage Vthn (indicated by a broken line in FIG. 2B) of the N MOS FET at time T2, the N MOS FET 26 is conductive. A positive charge, which is precharged in the common output terminal 24, is discharged through the N MOS FET 26, so that a level of the output terminal 24 goes down as shown in FIG. 2C. When the level of the output terminal 24 further falls to be below a threshold voltage Vthp (indicated by a broken line in FIG. 2C) of the P MOS FET, the P MOS FET 20 is conductive. Therefore, the P MOS FET 20 forms up a positive feedback loop for the N MOS FET 26, the output signal from the common output terminal 24 abruptly goes L level, as shown in FIG. 2C. At this time, the output of the ROM array 10-1 is charged by the power source VDD through the P MOS FETs 20 and 22, quickly as shown in FIG. 2B.

When the transistor is present in the addressed cell, the ROM array 10-1 is not conductive and the output signal of the ROM array 10-1 and the output signal from the common output terminal 24 are still in L and H levels, respectively, even when the precharge is completed.

According to the first embodiment, the threshold voltage of each of the sense amplifiers 14-1, 14-2, . . . , 14-N is substantially set by the threshold voltage Vthn of the N MOS FET, so that the output signal of the ROM is sensed rapidly after the finish of the precharge. Further, a through current is never produced because the output signal of the ROM is sensed through the positive feedback loop. Further, the logic gate (NOR gate) function for gathering the output signals of the ROM arrays into a single signal is contained in the sense amplifier per se. Even if the capacity of the ROM is increased, there is no need for a corresponding increase of the number of the elements.

Another embodiment of a sense amplifier circuit according to the present invention will be described. In the subsequent description, same reference numerals designate like portions in the first embodiment. FIG. 3 shows a circuit diagram of the second embodiment of the present invention. In this embodiment, the row selecting lines of the ROM arrays 10-1, 10-2, . . . , 10-N are individually connected to the address decoder 16, thereby eliminating the need for the array selecting transistors. For this reason, in the first embodiment, the ROM array not having a cell addressed after the end of the precharge is nonconductive. In the second embodiment, the ROM array having no addressed cell is also conductive. To this end, the second embodiment contains a logical multiplication. Specifically, output terminals of ROM arrays are respectively connected to gates of N MOS FETs 32, and source-drain paths of all the N MOS FETs 32 are connected in series between a common output terminal 24 and ground terminal. The N MOS FETs 32 form a NAND gate for an output signal of the ROM arrays, and correspond to the N MOS FETs 26 in FIG. 1.

To explain the operation, it is assumed that a cell of the ROM array 10-1 is addressed and the transistor is not present in the cell. All the ROM arrays are conductive when the precharge finishes, and voltages at the output terminals of the ROM arrays start to rise from L level. When the output levels of the ROM arrays exceeds the threshold voltage Vthn of the N MOS FET 32 forming the NAND gate, all the N MOS FETs 32 are conductive and the level at the common output terminal 24, which is precharged in an H level, decreases. When the level of the common output terminal 24 is below the threshold voltage Vthp of the P MOS FET 20, the P MOS FET 20 is also conductive to serve as a positive feedback loop for the N MOS FET 32. As a result, the level of the common output terminal 24 rapidly goes to an L level, so that the through current is not produced.

In case where the transistor is in the addressed cell, the ROM arrays except the ROM array 10-1 are conductive, and even if the N MOS FETs 32 in the sense amplifiers of the other arrays are conductive, the N MOS FET 32 in the sense amplifier 14-1 is not conductive so that the NAND gate is not conductive. As a result, the level at the common output terminal 24 is not lowered and therefore left in an H level.

Accordingly, the access to the ROM with a large capacitance can be performed for a short time without the increase of power consumption and the number of elements.

Figure 4:
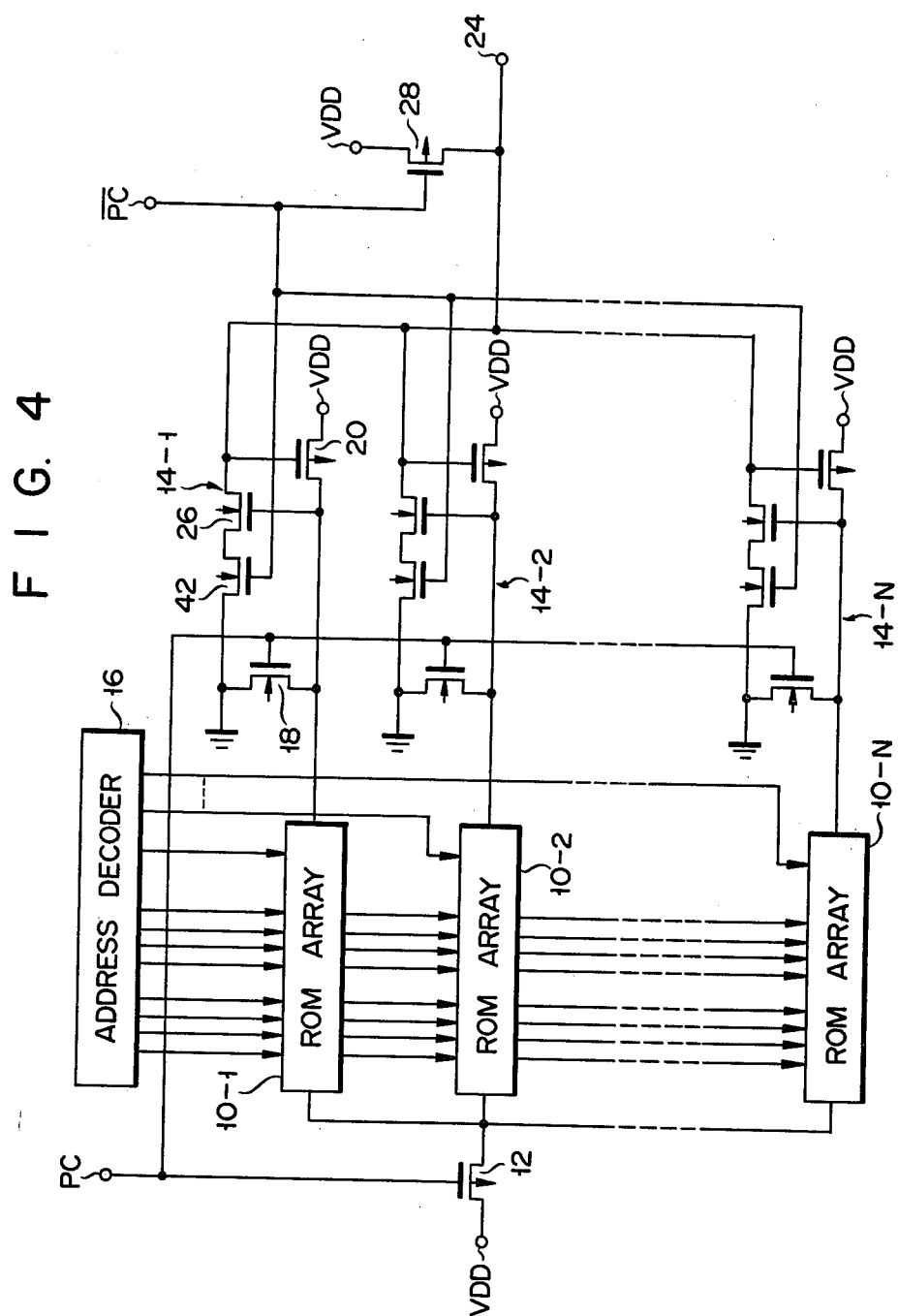

FIG. 4 shows a circuit diagram of a third embodiment of a sense amplifier circuit according to the present invention. In the third embodiment, a source-drain path of an N MOS FET 42 is connected between an N MOS FET 26 and a ground terminal, instead of the P MOS FET 22 in the first embodiment, and that a gate of the N MOS FET 42 is connected to an inverted precharge terminal $\overline{PC}$. Those points of the third embodiment are different from the first embodiment. Specifically, a series circuit of the N MOS FETs 42 and 26 in each sense amplifier serves as a NAND gate, and all the NAND gates are OR-connected. The operation is much the same as that of the first embodiment, and hence the explanation thereof will be omitted.

A fourth embodiment shown in FIG. 5 is a modification of the second embodiment. Unlike the second embodiment, a source-drain path of an N MOS FET 52 is inserted between the N MOS FETs 32 connected in series and a ground terminal, instead of the P MOS FET 22 of each sense amplifier in the second embodiment, and that a gate of the N MOS $\overline{FET}$ 52 is connected to an inverted precharge terminal $\overline{PC}$. In the arrangement, the N MOS FETs 32 and the N MOS FET 52 form a NAND gate. The operation thereof is much the same as that of the second embodiment, and therefore the explanation thereof will be omitted.

As described above, according to the present invention, there is provided a sense amplifier circuit which is small in power consumption and the number of elements, and short in the access period.

Having described a specific embodiment of our bearing, it is believed obvious that modification and variation of our invention is possible in the light of the above teachings. What we claim is:

1. A sense amplifier circuit which is used for a plurality of read only memory arrays each having a single output terminal in a complementally metal-oxide-semiconductor integrated circuit, and has a plurality of input terminals respectively connected to the output terminals of said read only memory arrays and a single output terminal, said sense amplifier circuit comprising:
   first and second power source terminals;
   first and second clock terminals supplied with complementary signals;
   a plurality of first transistors of a first channel type each connected between said first power source terminal and a corresponding one of said input terminals and each having a control terminal connected to said first clock terminal;
   a plurality of second transistors of a second channel type each connected between said second power source terminal and a corresponding one of said input terminals and each having a control terminal connected to said output terminal;
   a plurality of third transistors of the first channel type connected between said output terminal and said first power source terminal and each having a control terminal connected to a corresponding one of said input terminals;
   a plurality of fourth transistors connected between said first and second power source terminals through a corresponding one of said second and third transistors and each having a control terminal connected to either of said first and second clock terminals; and
   a fifth transistor of the second channel type connected between said output terminal and said second power source terminal and having a control terminal connected to said second clock terminal.

2. A sense amplifier circuit according to claim 1, in which said third transistors are connected in parallel between said output terminal and said first power source terminal.

3. A sense amplifier circuit according to claim 2, in which said fourth transistors are each comprised of a transistor of the second channel type which is connected between said second transistor and said second power source terminal and having a control terminal connected to said first clock terminal.

4. A sense amplifier circuit according to claim 2, in which said fourth transistors are each comprised of a transistor of the first channel type connected between said third transistor and said first power source terminal and having a control terminal connected to said second clock terminal.

5. A sense amplifier circuit according to claim 1, in which said third transistors are connected in series between said first and second power source terminals and one of the connection points in the series circuit of said third transistors is connected to said output terminal.

6. A sense amplifier circuit according to claim 5, in which said fourth transistors are each comprised of a transistor of the second channel type connected between said second transistor and said second power source terminal and having a control terminal connected to said first clock terminal.

7. A sense amplifier circuit according to claim 5, in which said fourth transistors are each comprised of a transistor of the first channel type connected between said series circuit of said third transistors and said first power source terminal and having a control terminal connected to said second clock terminal.

8. A sense amplifier circuit according to one of claims 3, 4, 6 and 7, in which said first and second power source terminals are ground and positive terminals, respectively, said first clock terminal is supplied with a logic 1 signal in a precharge mode and a logic 0 signal in other modes, said transistors of the first channel type are N channel metal oxide semiconductor field effect transistors and said transistors of the second channel type are P channel metal oxide semiconductor field effect transistors.

* * * * *